United States Patent [19]

Brunner et al.

[11] 4,117,093

[45] Sep. 26, 1978

[54] METHOD OF MAKING AN AMORPHOUS SILICON DIOXIDE FREE OF METAL IONS

[75] Inventors: Friedrich Christian Brunner; Friedrich Wilhelm Schwerdt, both of Sindelfingen; Hans-Heinz Steinbeck, Boeblingen, all of Fed. Rep. of Germany

[73] Assignee: International Business Machines Corporation, Armonk, N.Y.

[21] Appl. No.: 807,759

[22] Filed: Jun. 17, 1977

[30] Foreign Application Priority Data

Jul. 2, 1976 [DE] Fed. Rep. of Germany ....... 2629709

[51] Int. Cl.$^2$ .................... C01B 33/12; C01B 33/18
[52] U.S. Cl. .................................. 423/339; 51/308
[58] Field of Search .................. 106/288 B; 423/324, 423/325, 326, 335, 339; 51/308

[56] References Cited

U.S. PATENT DOCUMENTS

| | | | |
|---|---|---|---|
| 2,744,001 | 5/1956 | Harman et al. | 51/308 |
| 2,865,782 | 12/1958 | Strassburg | 423/325 |
| 3,208,823 | 9/1965 | Baker et al. | 106/288 B |
| 3,715,842 | 2/1973 | Treddinick et al. | 51/308 |
| 3,922,393 | 11/1975 | Sears | 51/308 |

*Primary Examiner*—Donald J. Arnold
*Attorney, Agent, or Firm*—David M. Bunnell

[57] ABSTRACT

Amorphous silicon dioxide particles for polishing semiconductor surfaces are prepared by boiling, at reflux, a mixture of surplus organic amine, a hydroxybenzene, water and silicon in the presence of oxygen to precipitate silicon dioxide.

5 Claims, No Drawings

METHOD OF MAKING AN AMORPHOUS SILICON DIOXIDE FREE OF METAL IONS

BACKGROUND OF THE INVENTION

The invention relates to a method of making an amorphous silicon dioxide free of metal ions, which in aqueous suspension is suitable for the mechanical polishing of semiconductor surfaces.

In the manufacture of semiconductor devices, thin monocrystalline silicon wafers are made by cutting a crystal of monocrystalline silicon. For further processing these wafers are fixed with was on a polishing block. The exposed surface of each wafer is then polished in order to remove the surface irregularities which are caused by the cutting of the crystal of monocrystalline silicon. Generally, the silicon wafers are processed in successive steps with grinding or polishing agents of different particle size. These process steps comprise the lapping and/or the so-called Blanchard grinding by which rough irregularities are removed from the surface, and finally one or several mechanical or chemical precision polishing processes which produce an extremely smooth and defect-free surface which subsequently is subjected to the known processing methods for making semiconductor devices.

As the polished surface of a silicon wafer is later supplied with a mask and etched, it is necessary for it to show a minimum of scratches and irregularities. Many attempts have been made to make high quality surfaces with different grinding and polishing agents. Polishing agents are known for the mechanical and/or chemical precision polishing process which contain aluminum oxide in alpha or gamma form, ceric oxide, copper-II-ions, diamond dust, silica sols or gels, or vitreous silicon dioxide and zirconium dioxide or zirconium silicate. It is furthermore known to fix the pH value of the polishing agents with alkali such as sodium hydroxide or with amines in a pH range between 9 and 12, or to add to the polishing agent an oxidizing compound, such as alkali peroxides or alkaline earth peroxides or organic oxidizing compounds in order to obtain a maximum abrasion per time unit. For prior art, reference is made to the article by E. Mendel, "Polishing of Silicon", is SCP and Solid State Technology, August 1967, pp. 27–39. The prior art is furthermore described in the following patents: U.S. Pat. Nos. 2,744,001, 3,071,455, GEP No. 1,621,473, U.S. Pat. No. 3,328,141, and GE-OS No. 1,644,725, GE-OS No. 2,305,188, and GEP No. 1,271,288.

For polishing silicon wafers, polishing agents containing a silicon dioxide powder are highly desirable because silicon dioxide shows a Mohs hardness of 7 which is very close to the hardness value of silicon and therefore shows a relatively high material abrasion rate. During the polishing process it is, therefore, not embedded in the surface of the polished silicon wafers. However, a disadvantage of the silicon dioxide-containing polishing agents is their sodium ion content which is due to the presence of $Na_y(SiO_x)$ compounds in the polishing suspension. Low quantities of the sodium ions adhere to the polished silicon surface and diffuse into the substrate during the subsequent high temperature process. Due to the high integration density of integrated circuits, however, even these low quantities of metal ions cause high leakage currents and thus the failure of the highly integrated circuits.

BRIEF SUMMARY OF THE INVENTION

It is the object of the invention to provide a process for making amorphous silicon dioxide free of metal ions, with a specifically uniform grain size, which is suitable for the mechanical polishing of semiconductor surfaces. The object of the invention also comprises a polishing agent with a content of amorphous silicon dioxide free of metal ions.

The object of the invention is achieved by a process for making silicon dioxide which is characterized in that a mixture of an organic amine in surplus, a hydroxybenzene, water and high-grade silicon are boiled under reflux with bubbling of purified air, and that the precipitate of silicon dioxide is rinsed with water and alcohol and dried, in a known manner.

The subject of the invention is also a polishing agent with a content of amorphous silicon dioxide free of metal ions, said dioxide being made in accordance with the process as disclosed by the invention, in aqueous suspension.

The amorphous silicon dioxide powder made in accordance with the invention is free of metal ions and has a specifically uniform grain size which avoids the formation of scratches on the surface of the silicon wafer due to the polishing agent itself. The silicon dioxide made in accordance with the process of the invention is effective in providing a high quality polished silicon surface.

DETAILED DESCRIPTION

The invention will be described in detail by means of the specific description and by the embodiment.

In a known polishing process (GEP No. 1,271,288) where silicon dioxide is used for polishing semiconductor surfaces it is employed in the form of alkali silicate gels or sols.

As already specified above, the process as disclosed by the invention starts from silicon and organic bases or acids which do not show a content of metal ions, particularly alkali metal ions or heavy metal ions, as copper. The manufacture of the amorphous silicon dioxide free of metal ions takes place as given in the following reaction equations. However, the process as disclosed in the invention is by no means limited to the use of the given specific diamine and the given 1,2-dihydroxy benzene.

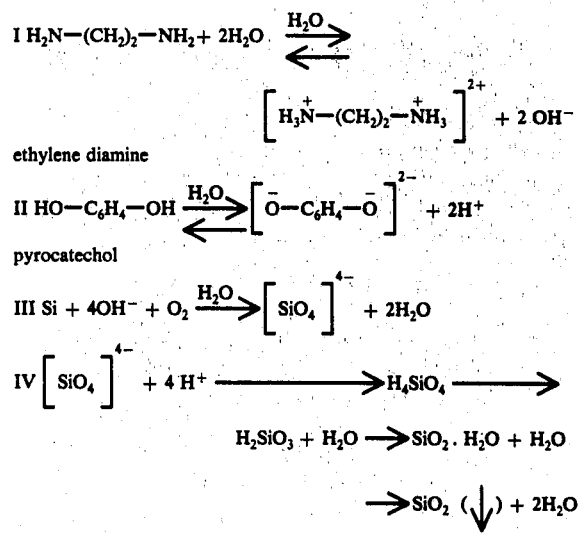

ethylene diamine pyrocatechol

Summation equation:

-continued

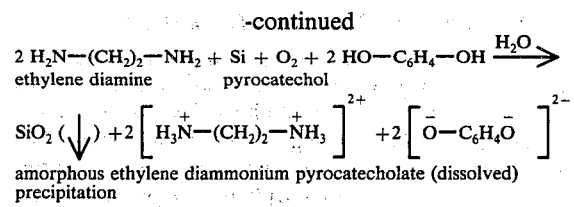

amorphous ethylene diammonium pyrocatecholate (dissolved)
precipitation

In accordance with step I, hydroxyl ions are formed by means of dissolving ethylene diamine in water. In the aqueous base (OH$^-$) and in the presence of oxygen the elementary silicon dissolves, forming orthosilicate anions (SiO$_4$)$^{4-}$ where the silicon is present in a +4 valency (step III). The orthosilicate anions are only permanent in an aqueous base surplus. They react upon the buffering of the base surplus with hydrogen ions over several steps, splitting off water, into amorphous silicon dioxide. The silicon dioxide required for polishing semicoductor surfaces is precipitated in that a sufficient amount of the surplus base is buffered by hydrogen ions (H$^+$) that the solubility product of the amorphous silicon dioxide is exceeded and thus precipitates (step IV). The hydrogen ions for buffering the base are obtained from dissolving pyrocatechol in water (step II).

Under the test conditions described in the following embodiment, an amorphous silicon dioxide with a uniform grain size of less tham 2 μm was obtained, which in an aqueous suspension for the polishing of silicon produces a scratch free polished surface.

Apart from 1,2-ethylene diamine, which has a pK$_1$ value of 9.93, other amines, e.g. 1,2 propylene diamine or diaminobutanes or also monoamines can be used in the process as disclosed by the invention. It is advantageous to use the amine in a large surplus, for instance in an approx. 10-fold molar surplus, referring to the quantity of the silicon used and to the quantity of the hydroxbenzene used.

The use of pyrocatechol (1,2-dihydroxybenzene) in the process as disclosed by the invention is particularly advantageous. Other useful dihydroxybenzenes are resorcin (1,3-dihydroxybenzene) and hydroquinone (1,4-dihydroxybenzene). The use of monohydroxybenzenes is advantageous, too.

The silicon, which is advantageously added to the aqueous alkaline solution in the form of thin disks, should be made oxide-free with diluted hydrofluoric acid and rinsed with deionized water to the conductance (absence of ions) of said deionized water prior to its use.

EXAMPLE

The production of the silicon dioxide polishing agent is described by means of a laboratory scale reaction.

160 ml deionized water are added to a 1 liter beaker and mixed with 340 ml ethylene diamine (pro analysis). The mixture heats up in that process to approx. 60° C. 60 g pyrocatechol (o-dihydroxybenzene) (pro analysis) are added to the mixture with stirring. The solution is then placed in a heated reflux apparatus, and 20 g purified silicon is added in the form of thin disks. Prior to the admixture, the silicon was made oxide-free by means of diluted hydrofluoric acid, and subsequently rinsed to the conductance of deionized water.

With continuous bubbling of purified air, the mixture with the silicon is boiled under reflux for approx. eight hours. After a short time, silicon dioxide precipitates in the form of a fine white deposit. After the reaction period the unreacted silicon is removed, and the precipitated white deposit of silicon dioxide is filtered off and thoroughly rinsed with deionized water. For better drying, the isolated silicon dioxide is finally suspended in isopropanol, filtered off once more, and dried in the oven at approximately 50° C. The reaction product is an amorphous silicon dioxide of high purity and uniform grain structure. It has a grain size of less than 2 μm.

POLISHING PROCESS

A crystal of monocrystalline silicon was cut into wafers with a thickness of approx. 600 μm. The surfaces of these wafers were lapped as a preparation for the subsequent polishing process, a lapping agent with a grain size of approx. 10 μm being used. In order to remove the surface defects on the silicon wafers, they were etched in a known manner which removed 30 μm per side of silicon. After having been cleaned by ultrasonics in water, the silicon wafers to be polished were fixed on a plate with wax. A polyurethane foam-covered linen cloth was placed on the polishing head of a standard polishing device. This cloth was moistened with an aqueous suspension of the amorphous fine-grain silicon dioxide made in accordance with the process described above. During the polishing process, a sufficient amount of suspension was added to keep the polishing cloth moist. The polishing head with the polishing cloth was firmly pressed against the surfaces of the silicon wafers. During the polishing process the polishing head and plate were rotated at a rate of about 40 cycles per minute.

After polishing for approximately 20 minutes, silicon wafers with an extremely smooth surface free of any scratches and defects were obtained.

What is claimed is:

1. A method of making an amorphous silicon dioxide free of metal ions comprising boiling a mixture of a hydroxybenzene, water, high grade silicon and organic amine in molar surplus to the amount of silicon and hydroxybenzene under reflux with bubbling oxygen to precipitate silicon dioxide, and rinsing the precipitated silicon dioxide with water.

2. The method of claim 1 including the steps of rinsing the silicon dioxide with alcohol and drying.

3. The method of claim 1, in which the silicon is added to the hydroxybenzene-water solution in the form of thin disks, and that prior to being added the silicon is cleaned with diluted hydrofluoric acid.

4. The method of claim 1 in which the organic amine is ethylene diamine and in which the hydroxybenzene is pyrocatechol.

5. The method of claim 4 in which the ethylene diamine and pyrocatechol are used in a mole ratio of about 10:1.

* * * * *